United States Patent [19]
Loo et al.

[11] Patent Number: 5,648,893
[45] Date of Patent: Jul. 15, 1997

[54] UPGRADABLE MULTI-CHIP MODULE

[75] Inventors: Mike C. Loo, San Jose; Alfred S. Conte, Hollister, both of Calif.

[73] Assignee: Sun Microsystems, Inc., Mountain View, Calif.

[21] Appl. No.: 310,136

[22] Filed: Sep. 21, 1994

Related U.S. Application Data

[63] Continuation-in-part of Ser. No. 99,740, Jul. 30, 1993, abandoned.

[51] Int. Cl.⁶ .................................................... H05K 7/00
[52] U.S. Cl. ........................ 361/820; 257/727; 439/73; 439/331
[58] Field of Search ............................ 174/52.1, 52.4; 206/328, 329, 334; 324/73.1, 755, 758, 760; 257/726, 727; 361/704, 709–710, 761, 767–771, 820; 439/68–73, 266, 267, 270, 331

[56] References Cited

U.S. PATENT DOCUMENTS

| | | | |
|---|---|---|---|
| 4,169,642 | 10/1979 | Mouissie . | |
| 4,597,617 | 7/1986 | Enochs | 439/331 |
| 4,724,514 | 2/1988 | Kaufman | 361/710 |
| 4,933,808 | 6/1990 | Horton et al. | 361/770 |
| 5,065,280 | 11/1991 | Karnezos et al. . | |
| 5,290,193 | 3/1994 | Goff et al. | 439/331 |
| 5,453,701 | 9/1995 | Jensen et al. | 324/755 |

FOREIGN PATENT DOCUMENTS

| | | |
|---|---|---|
| 0 462 552 | 12/1991 | European Pat. Off. . |
| 35 09 734 | 9/1985 | Germany . |

OTHER PUBLICATIONS

IBM Tech Discl. Bulletin, "Flip Chip Burn–in Socket", vol. 36, No. 10, Oct. 1993, pp. 289.

IBM Technical Disclosure Bulletin, "Flexible module carrier direct connection package":, vol. 28, No. 7, Dec. 1985, New York, U.S., pp. 2855–2856.

*Primary Examiner*—Gregory D. Thompson
*Attorney, Agent, or Firm*—Kang S. Lim

[57] ABSTRACT

A substrate, an alignment plate, a heat sink, a back plate, a plurality of spacers, and a plurality of nuts are used to removably package one or more semiconductor package into a single module. The semiconductor dies are packaged with tape automated bonding (TAB) packages having land grid array (LGA) outer lead bumps. The substrate comprises a number of land patterns, a number of alignment cavities, and a number of join cavities. The alignment plate is fabricated with a number of alignment pins, a number of housing cavities, and a number of join cavities. The heat sink is fabricated with a number of stems and a number of join cavities. The back plate is fabricated with a number of extrusions having threaded ends. The spacers are fabricated with ranged openings at both ends, and each spacer is loaded with a number of spring washers. The nuts are fabricated with stepped heads. The extrusions, the land patterns and the alignment and join cavities of the substrate, the alignment pins and the housing and join cavities of the alignment plate, the stems and the join cavities of the heat sink, the spring washer loaded spacers, and the stepped head nuts are coordinated in their numbers, sizes and geometric locations, as a result, the semiconductor packages may be easily replaced at a later time with enhanced versions, and the replaced semiconductor packages are salvageable. In some embodiments, a biasing member, such as a leaf spring, is provided in each housing cavity (aperture) of the alignment plate for biasing the semiconductor packages against one or more walls of each aperture.

18 Claims, 8 Drawing Sheets

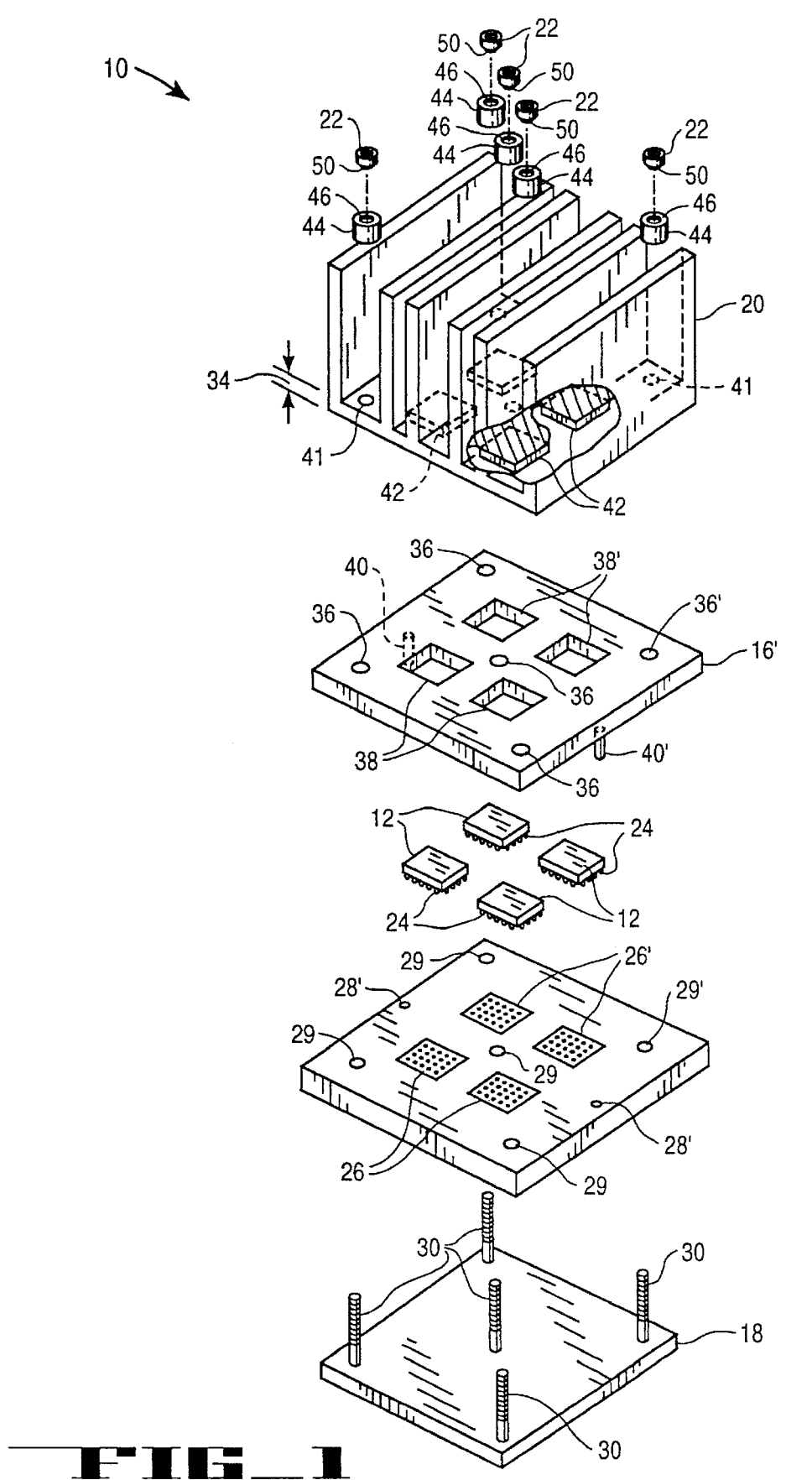
FIG_1

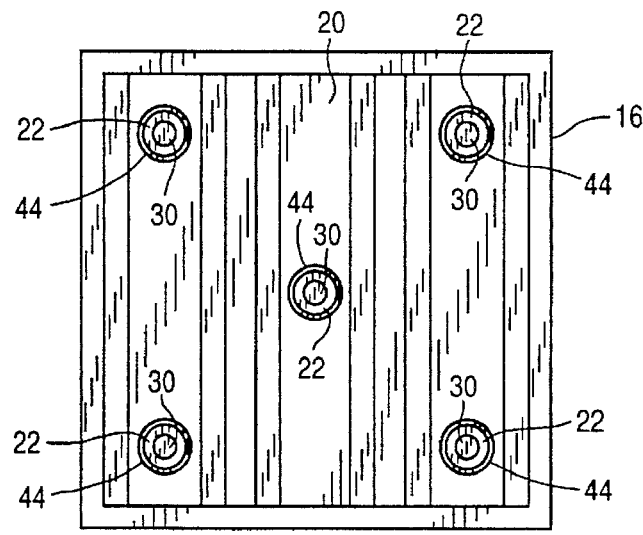
FIG_2
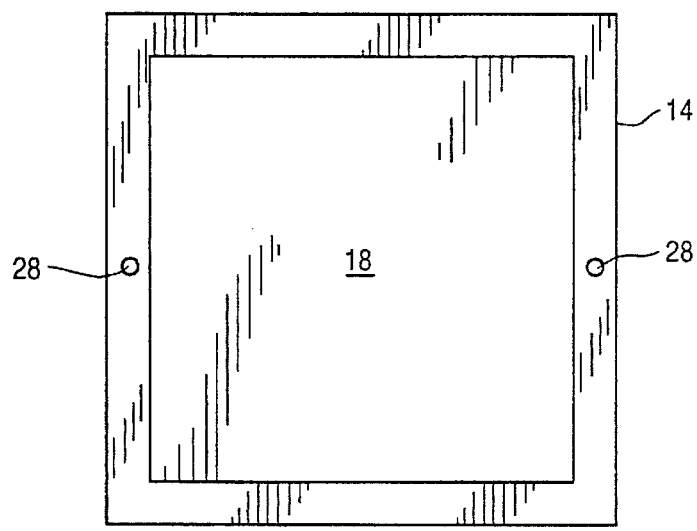
FIG_3
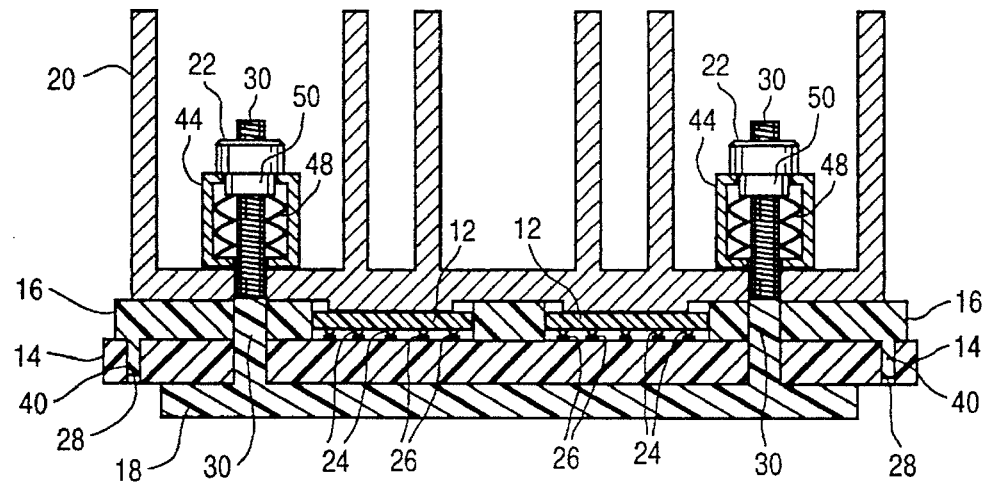
FIG_4

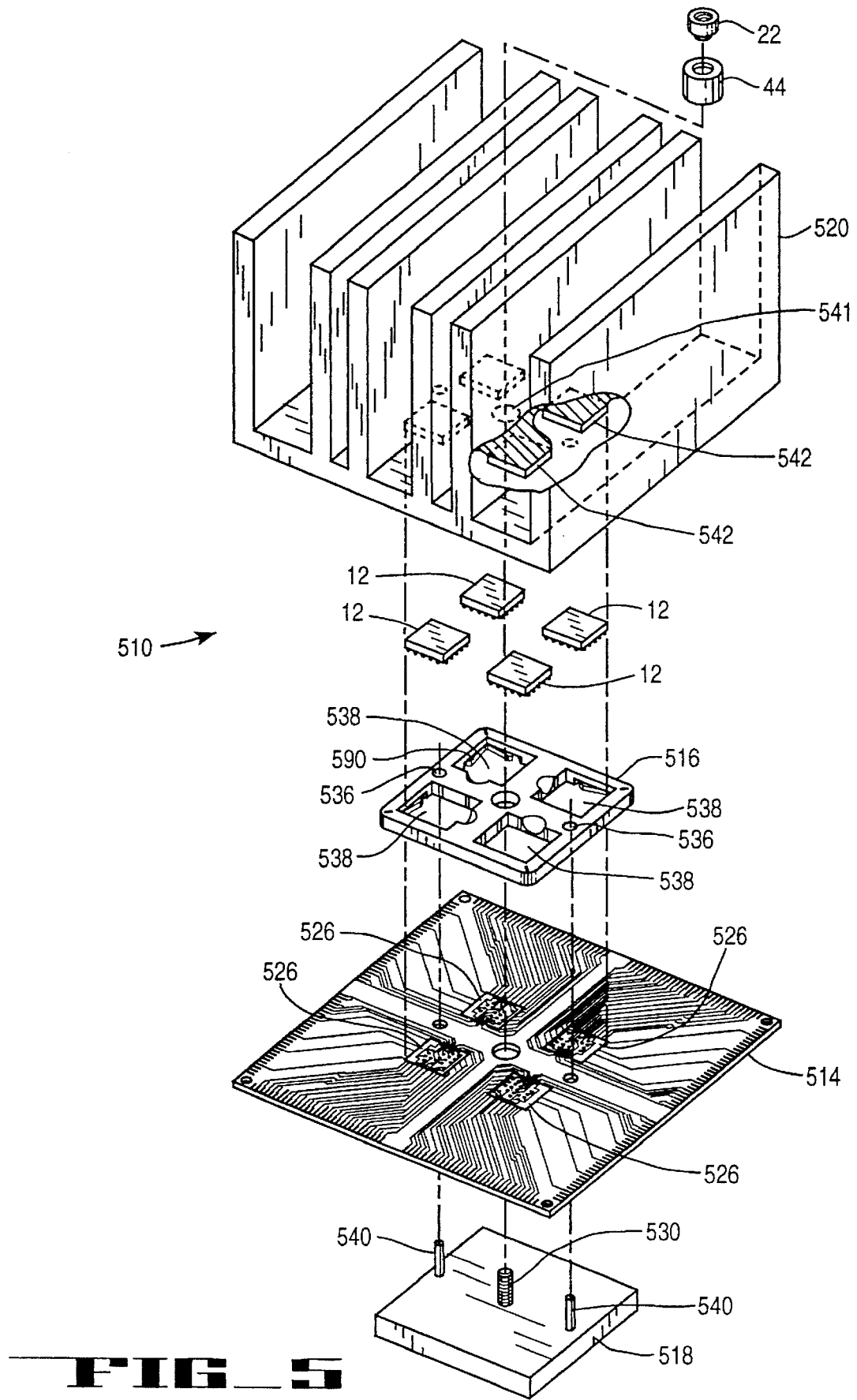
FIG_5

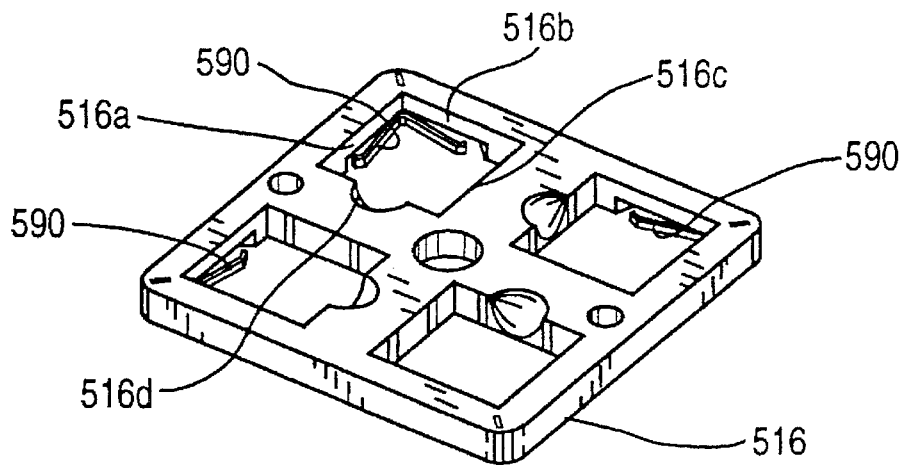
FIG_6A
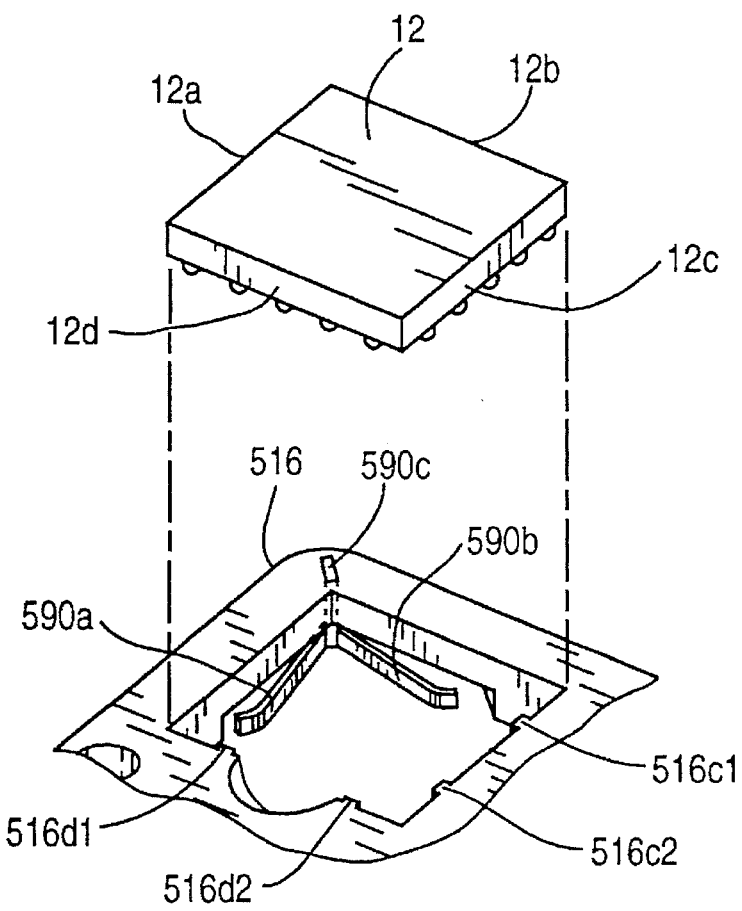
FIG_6B

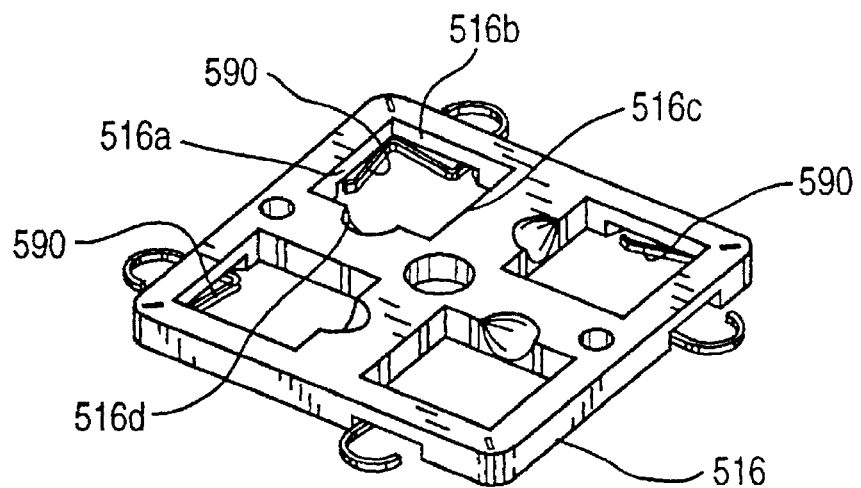
FIG_6C
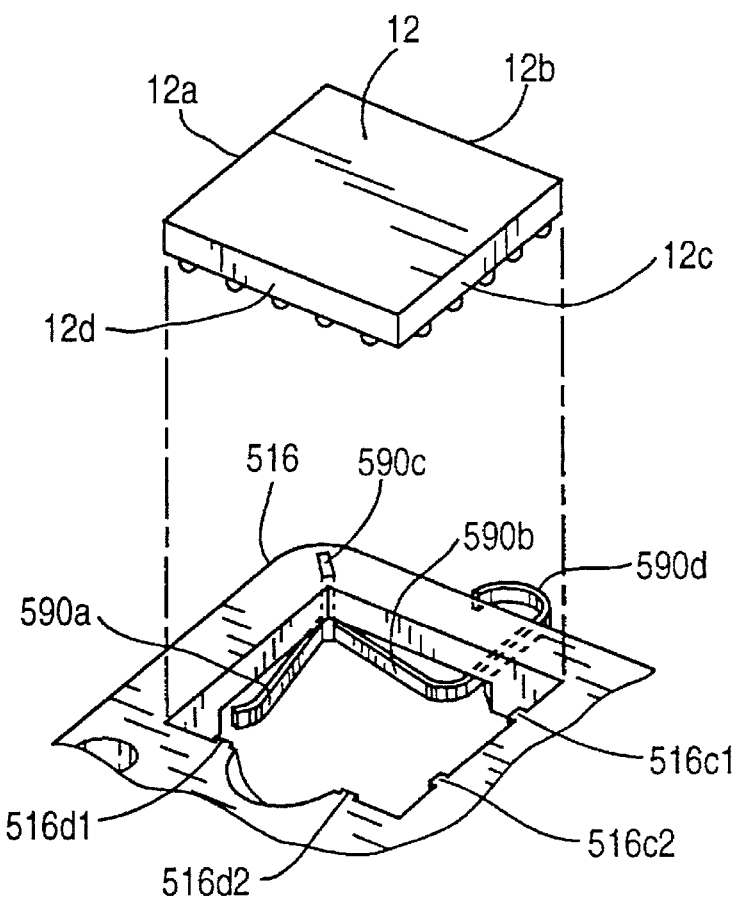
FIG_6D

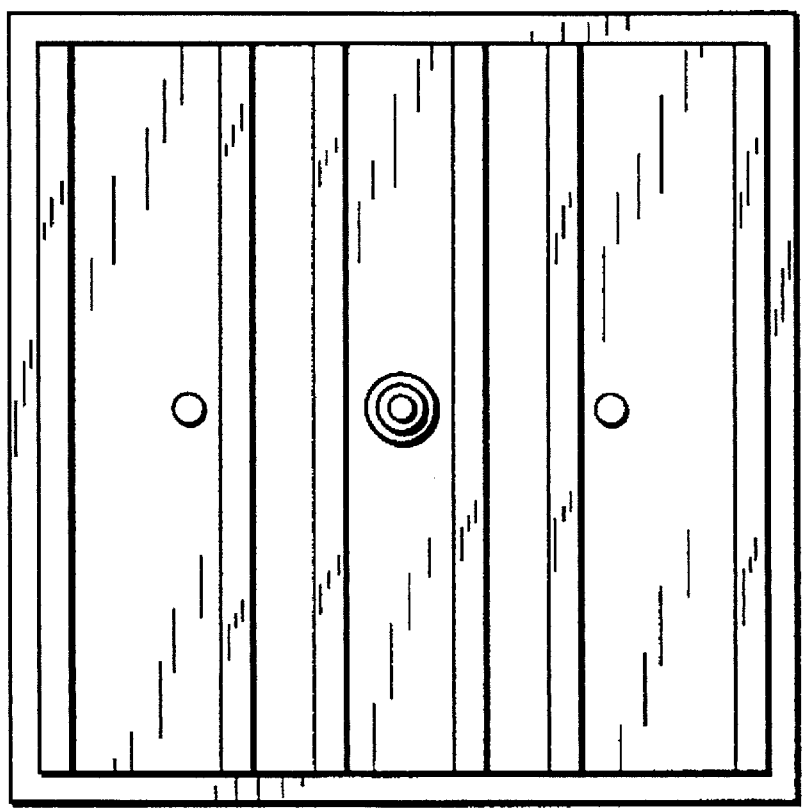
FIG_7

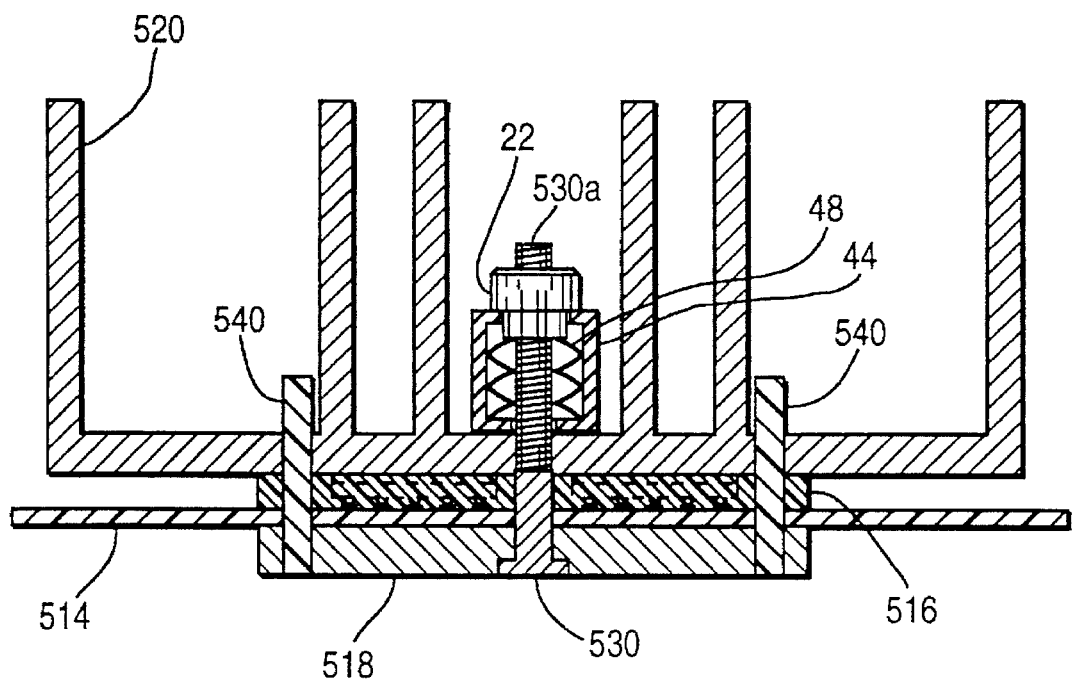
FIG_8A
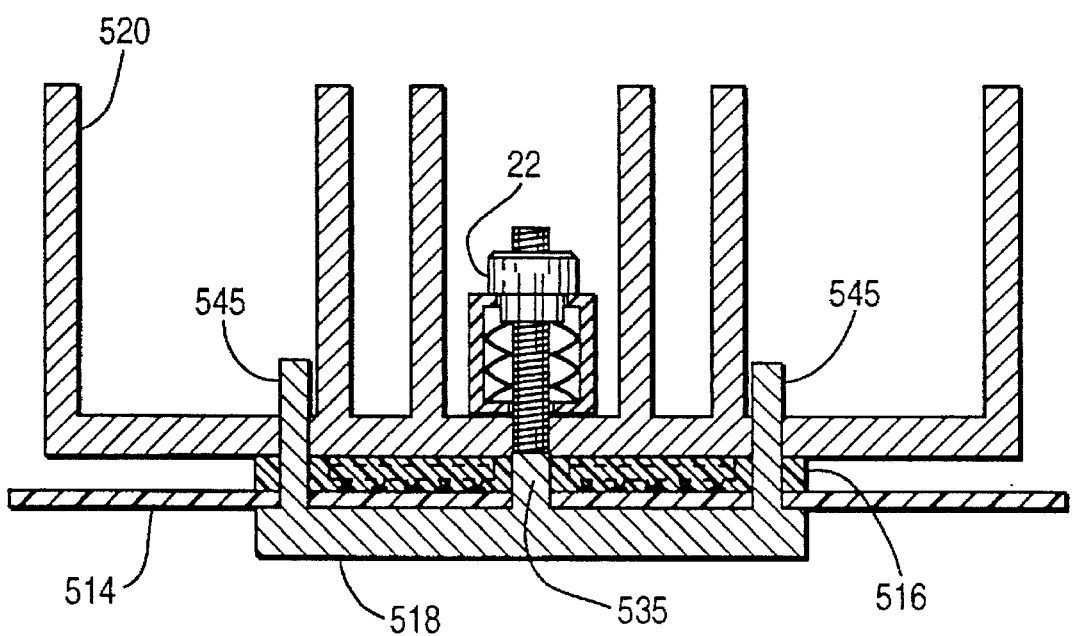
FIG_8B

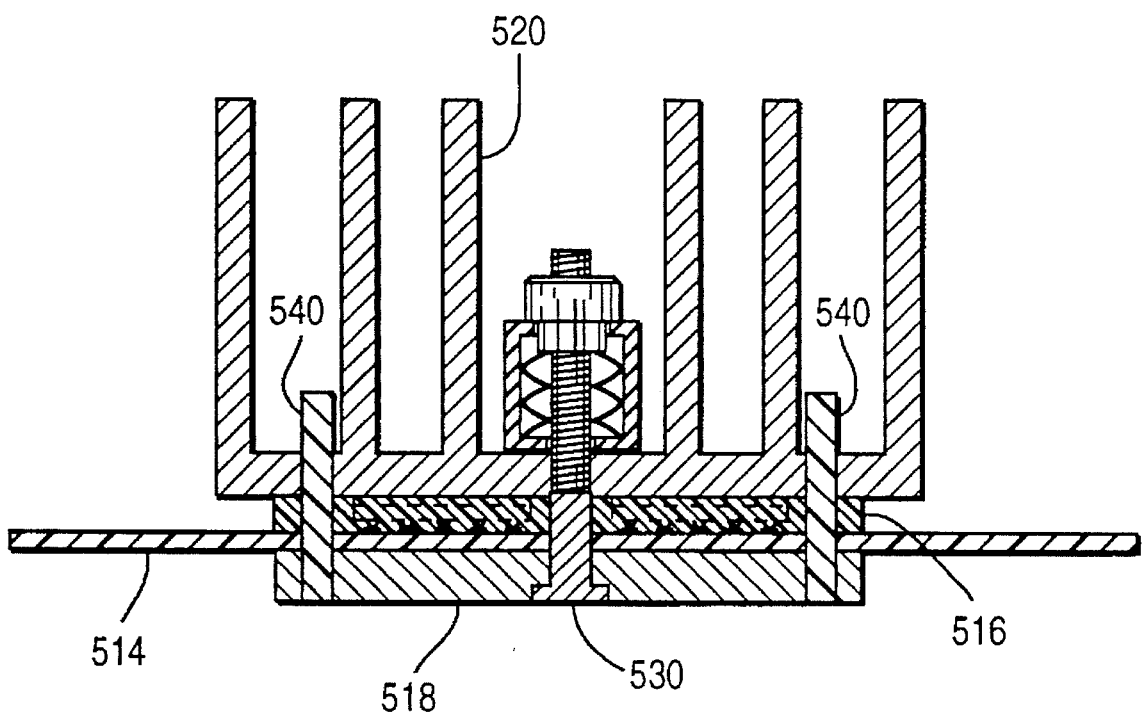
FIG_8C

UPGRADABLE MULTI-CHIP MODULE

RELATED APPLICATIONS

The present application is a continuation-in-part of a U.S. patent application entitled "UPGRADABLE MUTI-CHIP MODULE" filed on Jul. 30, 1993 and having Ser. No. 08/099,740, hereby incorporated by reference, now abandoned.

This application is related to and commonly-assigned U.S. patent application Ser. No. 08/310,159, filed on Sep. 21, 1994, now abandoned by Charles Pickles for "ELASTOMER MATERIAL FOR USE WITH SEMICONDUCTOR CHIP MOUNTED ONTO A SUBSTRATE". The above-identified Pickles application is hereby incorporated by reference.

FIELD OF THE INVENTION

The present invention relates to the field of semiconductor packaging. More specifically, the present invention relates to removably packaging one or more semiconductor package into a single module.

BACKGROUND OF THE INVENTION

Packaging semiconductor package(s) into a single module is well known in the art. Typically, the semiconductor packages are mounted onto the module by one of a number of well known techniques, such as flip chip, tape automated bonding (TAB) or wire bonding. These prior art mounting/packaging techniques all have a common disadvantage in that they require the semiconductor packages to be permanently mounted to the board or substrate of the module e.g., by soldering. Hence, upgrading a digital system which includes such a module involves replacing the entire module.

This is especially undesirable when the semiconductor packages contain costly VLS1 chips, e.g., microprocessors and related application specific integrated circuits (AS1Cs). Thus, it is desirable to be able to assemble one or more semiconductor packages into a single module in a removeable manner. That is, the semiconductor packages are not permanently mounted and they can be easily replaced or upgraded at a later time, and the replaced semiconductor packages are salvageable. As will be disclosed, the present invention provides for an upgradable multi-chip module which advantageously achieves the desired results.

SUMMARY OF THE INVENTION

The desired results are advantageously achieved by packaging the semiconductor dies with tape automated bonding (TAB) packages having land grid array (LGA) outer lead bumps. The semiconductor packages are then packaged into a single assembly using a substrate, an alignment member, a heat sink, a back plate, a plurality of spacers, and a plurality of nuts. The substrate comprises a plurality of land patterns, a plurality of alignment cavities, and a plurality of join cavities. The alignment plate is fabricated with a number of alignment pins, a plurality of housing cavities (apertures), and a plurality of join cavities. The heat sink is fabricated with a plurality of stems, and a plurality of join cavities. The back plate is fabricated with a number of extrusions having threaded ends. The spacers are fabricated with flanged openings at both ends, and each spacer is spring loaded with a number of spring washers. Alternatively, the spring washers can be replaced by a coil spring. The nuts are fabricated with stepped heads. The extrusions of the back plate, the land pattern and the alignment and join cavities of the substrate, the alignment pins and the housing and join cavities of the alignment plate, the stems and the join cavities of the heat sink, the spring washer loaded spacers, and the stepped head nut are coordinated in their numbers, sizes and geometric locations.

The assembly is completed in the following manner. The substrate is first removably placed on top of the back plate, with the join cavities of the substrate accommodating the extrusions. The alignment plate is then removably placed on top of the substrate, with the alignment cavities of the substrate accommodating the alignment pins, and the join cavities of the alignment plate accommodating the extrusions. The semiconductor packages are then removably placed on top of the land pattern of the substrate, with the housing cavities of the alignment plate accommodating the semiconductor packages. The heat sink is then removably placed on top of the alignment plate, with the stems making direct contact with the semiconductor packages and the join cavities of the heat sink accommodating the extrusions. Next, the spring washer loaded spacers are removably slipped onto the extrusions of the back plate. Finally, the back plate, the substrate, the semiconductor packages, the alignment plate, the heat sink, and the spring loaded spacers are removably joined together as a single module, and secured by removably threading the stepped head nuts onto the threaded ends of the extrusions until they firmly press against the spring loaded spacers.

In some embodiments, each semiconductor package is biased against at least one wall of each aperture by a suitable biasing element, such as a leaf spring. Each biasing element is wedged between each package and the wall(s) of each aperture. In one embodiment, each biasing element has two portions firmly pressing each semiconductor package along two different axis against two respective walls of each aperture. An optional attachment can be added to one end of the biasing element which extends outside the alignment member. By manipulating the attachment, the biasing element can be precompressed thereby allowing the semiconductor package to be easily inserted into the aperture of the alignment member.

BRIEF DESCRIPTION OF THE DRAWINGS

The objects, features, and advantages of the present invention will be apparent from the following detailed description of the presently preferred and alternate embodiments of the invention with reference to the drawings in which:

FIG. 1 illustrates an exploded front perspective view of one embodiment of a semiconductor package in accordance with the present invention.

FIG. 2 is the top view of the semiconductor package of FIG. 1.

FIG. 3 is the bottom view of the semiconductor package of FIG. 1.

FIG. 4 is a cross sectional view of the semiconductor package of FIG. 1.

FIG. 5 illustrates an exploded front perspective view of another embodiment of the semiconductor package of the present invention.

FIG. 6A is perspective view of an alignment member for the semiconductor package of FIG. 5.

FIG. 6B is a close-up view showing one quadrant of the alignment member of FIG. 6A.

FIG. 6C and 6D show the alignment member with an external attachment.

FIG. 7 is the top view of the semiconductor package of FIG. 5.

FIG. 8A, 8B, and 8C are cross sectional views of three variations of the semiconductor package of FIG. 5.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. For example, this invention is applicable to both single and multiple semiconductor package modules. In other instances, well known systems are shown in diagrammatical or block diagram form in order not to obscure the present invention unnecessarily.

Referring now to FIGS. 1–4, the multi-chip module in accordance with one embodiment of the present invention 10 comprises a number of semiconductor packages 12, a substrate 14, an alignment plate 16, a heat sink 20, a back plate 18, a plurality of spacers 44, and a plurality of nuts 22. For ease of illustration and understanding, four semiconductor packages 12 and five sets of nuts and spacers 22 and 44 are shown, however, based on the description to follow, it will be appreciated that the present invention may be practiced with one or more semiconductor package, and with more or less nut and spacer sets.

The semiconductor dies (not shown) are packaged using tape automated bonding (TAB) semiconductor packages 12 with land grid array (LGA) outer lead bumps 24. The LGA outer lead bumps 24 may or may not be cushioned, depending on the sizes of the inter-bump pitches. TAB semiconductor packages with uncushioned LGA outer lead bumps are well known in the art. For a more detailed description of TAB semiconductor packages with cushioned LGA outer lead bumps, see copending U.S. patent application, Ser. No. 08/099,740, filed contemporaneously, assigned to the assignee of the present invention, and hereby fully incorporated by reference.

The substrate 14 comprises a plurality of land patterns 26, a plurality of alignment cavities 28, and a plurality of join cavities 29. The substrate 14 is made of well known materials, such as glass, epoxy, laminate and ceramic, and the land patterns 26 are formed using a well known conductive material, such as gold. The land patterns 26, the alignment cavities 28, and the join cavities 29 are disposed on the substrate 14 in a symmetrical manner. While the land patterns 26 are shown in the four quadrants, the alignment cavities 28 are shown at the mid-point of two outer edges, and the join cavities 29 are shown in the four corners and the center, it will be appreciated that the land patterns 26 and the alignment and join cavities 28 and 29 may be disposed in a variety of arrangements on substrate 14. The numbers and sizes of the alignment and join cavities 28 and 29 will be described in further detail below.

The alignment plate 16 is fabricated with a number of alignment pins 40, a plurality of housing cavities (apertures) 38, and a plurality of join cavities 36. The alignment plate 16 is made of a well known polymer material, such as polyphenylene sulfide. The geometric locations of the alignment pins 40 are precisely coordinated with the alignment cavities 28 of the substrate 14. The precision is dependent on the inter-bump pitches of the LGA outer lead bumps 24. For inter-bump pitches between 0.8 mm and 0.5 mm, preferably, the precision is within +/− 0.07 mm. The numbers and planery sizes of the alignment pins 40 are also coordinated with the alignment cavities 28 of substrate 14. Additionally, the lengths of the alignment pins 40 are coordinated with the thickness of the substrate 14. The numbers, sizes, and geometric locations of the housing cavities 38 are coordinated with the semiconductor packages 12 and the land patterns 26 of the substrate 14. The numbers, sizes, and geometric locations of the join cavities 36 are coordinated with the join cavities 28 of the substrate 14. While for ease of illustration and understanding, only two alignment pins are shown, it will be appreciated that the present invention may be practiced with one or more alignment pins.

The heat sink 20 is fabricated with a plurality of stems 42 and a plurality of join cavities 41. The heat sink 20 is made of a well known thermal conductive material, such as, aluminum or copper. The numbers and sizes of the stems 42 are coordinated with the semiconductor packages 12, the housing cavities 38 of the alignment plate 16, and the land patterns 26 of the substrate 14. The numbers, sizes, and geometric locations of the join cavities 41 are coordinated with the join cavities 36 of the alignment plate 16, and the join cavities 29 of the substrate 14. While a fork type of heat sink 20 is shown, it will be appreciated that the present invention may be practiced with other types of heat sinks.

The back plate 18 is fabricated with a number of extrusions 30 having threaded ends. Alternatively, extrusions 30 may be replaced by threaded screws formed separately and attached to back plate 18. The back plate 18 is made of a suitable rigid material, such as stainless steel. The heights of the extrusions 30 are coordinated with the thicknesses of the substrate 14, the alignment plate 16, the heat sink 20 (i.e., the base height 34 of the fork type heat sink 20 shown), the spacers 44 and the nuts 22. The numbers, planery dimensions and the geometric locations of the extrusions 30 are coordinated with the inside dimensions of the join cavities 29 of the substrate 14, the join cavities 36 of the alignment plate 16, and the join cavities 41 of the heat sink 20.

The spacers 44 are fabricated with flanged openings 46 at both ends. Additionally, each spacer 44 is spring loaded with a number of spring washers 48 of known spring constant during deflection. Alternatively, spring washers 48 can be replaced by a coil spring. The inside dimensions of the spacers 44 are coordinated with the total dimensions of the spring washers 48 used. Each spring washer assembly has a spring constant of 3 kilo-pound per inch (klb/in) to 8 klb/in during deflection, are loaded in each spacer 44. However, coil springs or other similar materials may also be used in lieu of the spring washers. The nuts 22 are fabricated with stepped heads 50. The outside dimensions of the steps of the stepped heads 50 are coordinated with the inside dimensions of the flanged openings 46 of the spacers 44, allowing the stepped heads 50 of the nuts 22 to apply pressure to the spring washers 48 loaded in the spacers 44.

Assembly of the above described embodiment is as follows. The substrate 14 is first placed on top of the back plate 18, with the join cavities 29 of the substrate 14 accommodating the extrusions 30. The alignment plate 16 is then placed on top of the substrate 14 with the alignment cavities 28 of the substrate 14 accommodating the alignment pins 40, and the join cavities 36 of the alignment plate 16 accommodating the extrusions 30. The semiconductor packages 12 are then removably placed on top of the land patterns 26 of the substrate 14, with the housing cavities 38 of the alignment plate 16 accommodating the semiconductor packages 12. The heat sink 20 is then removably placed on top of the alignment plate 16, with the stems 42 making direct contact with the semiconductor packages 12, and the join cavities 41 accommodating the extrusions 30. Next, the spring washer 48 or coil spring loaded spacers 44 are slipped onto the extrusions 30. Finally, the back plate 18, the substrate 14, the semiconductor packages 12, the alignment plate 16, the heat sink 20, and the spring washer 48 loaded spacers 44 are removably joined together to form a single module 10, and secured by removably threading the stepped head nuts 22 onto the threaded ends of the extrusions 30 until they firmly press against the spring washer 48 loaded spacers 44.

As a result of the constant deflection of spring washers 48 caused by the pressure applied to the spring washers 48 by the stepped head nuts 22, constant pressure is applied to the semiconductor packages 12 by the stems 42 of the heat sink 20. In turn, the constant pressure applied to the semiconductor packages 12 causes physical and electrical contacts between the LGA outer lead bumps 24 of the semiconductor packages 12 and the land patterns 26 of the substrate 14 to be maintained.

In accordance with one aspect of the invention, the semiconductor assembly, i.e., module 10, can be disassembled and the semiconductor package(s) 12 removed or replaced, by first unscrewing nuts 22 and then removing spring washers 48 and heat sink 20, thereby exposing the alignment plate 16 which orients the package(s) 12. The semiconductor package(s) 12 can now be removed or replaced. Reassembly is accomplished in the manner described above.

FIG. 5 is a perspective exploded view of a semiconductor assembly 510 comprising a heat sink 520, an alignment member 516 for orienting one or more of semiconductor package(s) 12, a substrate 514 and a base plate 518. As described in greater detail below, a single spring-loaded fastener 530 provides the pressure for compressing semiconductor assembly 510 and forming reliable electrical contacts between contact pads of semiconductor package(s) 12 and corresponding land patterns 526 of substrate 514.

In this implementation, as shown in the exploded and cross sectional views of FIGS. 5 and 8A, respectively, fastener 530 is a flat-headed screw with a threaded end 530a projecting from back plate 518. Fastener 530 can be attached to back plate 518 in a variety of ways, e.g., the screw head can be embossed, countersunked or recessed in back plate 518. With this single fastener embodiment, since there are no fastener(s) closer to the edge(s) of base plate 518, base plate 518 must be rigid enough to resist flexing. Suitable rigid materials include stainless steel, ceramic and graphite. For example, in stainless steel, the thickness of base plate 518 should preferably be greater than 0.100 inches, while for ceramic and graphite the thickness should preferably be greater than 0.075 inches. This single fastener arrangement advantageously reduces the total number of components and assembly time, thereby providing a cost-effective semiconductor packaging solution.

FIGS. 5 and 8A also show a pair of alignment pins 540 projecting from base plate 518. Alignment pins 540 are inserted into base plate 518 and extend through substrate 514 and cavities 536 of alignment member 516 to orient semiconductor package(s) 12 with respect to substrate 514, i.e., to ensure that the contact pads of package(s) 12 maintain proper alignment with the respective land pattern(s) 526 on substrate 514. Alignment pins 540 can be manufactured from a variety of materials including plastics and metals.

FIGS. 6A and 6B show alignment member 516 in greater detail, and an exploded view of one quadrant of alignment member 516, respectively. In accordance with another aspect of the invention, instead of relying solely on the walls of aperture(s) 538 to orient package(s) 12, at least one edge of each package 12 is biased against a corresponding wall of each aperture 538. In this embodiment, a biasing element 590, wedged between at least one wall of aperture 538 and at least one edge of semiconductor package 12, firmly pressing an opposing edge of package 12 against an opposing wall of aperture 538. As shown in FIG. 6B, biasing element 590 includes a pair of leaf springs 590a, 590b and a central pivoting portion 590c inserted into a slot of alignment member 516.

Leaf springs 590a, 590b press firmly against a corresponding pair of edges 12a, 12b of package 12, thereby providing pressure along the opposing edges 12c, 12d of package 12 with a corresponding pair of walls 516c, 516d of alignment member 516, respectively. In this implementation, two pairs of notches 516c1, 516c2 and 516d1, 516d2 provide an extra level of precision alignment along the respective walls 516c, 516d. As shown in FIG. 6C and 6D, an optional attachment 590d can be added to one end of biasing element 590 which extends outside the alignment member by manipulating the attachment, biasing element 590 can be precompressed thereby allowing the semiconductor package to be easily inserted into the aperture of the alignment member. As apparent to one skilled in the art, biasing element 590 can also be fabricated from a variety of materials, including compressible, elastic, and flexible metallic or plastic material. In addition, biasing element 590 can have a variety of physical shapes and forms. For example, coil springs can be used in place of the leaf springs.

The assembly sequence of this embodiment is similar to that of the previously described embodiment. Briefly, substrate 514 is first placed on top of back plate 518 accommodating fastener 530 and alignment pins 540. Alignment member 516 is then placed on top of substrate 514, with alignment cavities 28 of substrate 514 accommodating alignment pins 540. The semiconductor package(s) 12 are then inserted into aperture(s) 538 of alignment member 516 thereby orienting the package(s) 12 with respect to the land patterns 526 of substrate 514. As discussed above, biasing member 590 provides precision orientation by firmly pressing each package 12 against the wall(s) of each aperture 538. Next, heat sink 520 is placed on top of alignment member 516, with stem(s) 542 in direct contact with package(s) 12, and with join cavity 541 accommodating fastener 530.

Referring now to FIG. 8A, one or more spring washer 48 and a spacer 44 are slipped onto fastener 530. The whole assembly 510 which includes back plate 518, substrate 514, package(s) 12, alignment member 516, heat sink 520 can now be firmly compressed by spring loading fastener 530. Fastener 530 is spring-loaded by threading a stepped head nut 22 onto threaded end 530a of fastener 530 until nut 22 firmly presses against spring washer 48 and spacer 44. Note that semiconductor assembly 510 can be repeatedly disassembled and reassembled, by reversing and repeating, respectively, the assembly sequence described above.

Many variations are possible without deviating from the scope of the present invention. For example, as shown in FIG. 8B, screw 530 of FIG. 8A can be replaced by an integral extension 535 from base plate 518, e.g., by extrusion or welding. Similarly, alignment pins 540 of FIG. 8A can also be replaced by a pair of integral extensions extruded from or welded to base plate 518 as shown in FIG. 8B. The physical dimensions of heat sink 520 can also vary substantially depending on the amount of heat generated by semiconductor packages 12 and the amount of physical space available. FIG. 8C shows a variation of heat sink 530 which occupies a smaller physical space.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. For example, the present invention is also applicable to semiconductor assemblies which are liquid cooled instead of air cooled. Hence, the description is thus to be regarded as illustrative instead of limiting on the present invention.

What is claimed is:

1. An alignment member for aligning a semiconductor package to a substrate, said semiconductor package and substrate having a first and second plurality of electrical contacts, respectively, said alignment member comprising:
   an aperture for removably orienting said semiconductor package over said substrate; and
   a biasing element having a first portion adapted to be wedged between a first edge of said semiconductor package and a first wall of said aperture for pressing said first edge against said first wall thereby maintaining alignment between said first and second plurality of electrical contacts, and wherein said biasing element includes an attachment coupled to said first portion and extending outside the alignment member, for precompressing said biasing element thereby allowing the semiconductor package to be inserted easily into said aperture.

2. The alignment member of claim 1 further comprising:
   a plurality of alignment cavities cooperating with a corresponding plurality of alignment pins for securing said alignment member to said substrate.

3. The alignment member of claim 1 wherein said first portion of said biasing element is a spring.

4. The alignment member of claim 3 wherein said first portion is a metallic spring.

5. The alignment member of claim 3 wherein said first portion is a leaf spring.

6. The alignment member of claim 1 wherein said first portion of said biasing element is made of a compressible material.

7. The alignment member of claim 1 wherein said first portion of said biasing element is made of an elastic material.

8. The alignment member of claim 1 wherein said first portion of said biasing element adapted to maintain alignment of said semiconductor package along a first axis of said substrate.

9. The alignment member of claim 1 wherein said attachment is hook shaped.

10. The alignment member of claim 8 wherein said biasing element further includes a second portion adapted to be wedged between a second edge of said semiconductor package and a second wall of said aperture for maintaining alignment of said semiconductor package along a second axis of said substrate.

11. The alignment member of claim 10 wherein said second portion of said biasing element is a spring.

12. The alignment member of claim 11 wherein said second portion is a metallic spring.

13. The alignment member of claim 11 wherein said second portion is a leaf spring.

14. The alignment member of claim 10 wherein said second portion of said biasing element is made of a compressible material.

15. The alignment member of claim 10 wherein said second portion of said biasing element is made of an elastic material.

16. A method of aligning a removable semiconductor package to a substrate, the method comprising the steps of:
   precompressing a biasing element of an alignment member configured to maintain alignment between a first plurality of electrical contacts of said removable semiconductor package and a corresponding second plurality of electrical contacts on said substrate said precompressing step accomplished by manipulating an attachment coupled to said biasing element and extending outside said alignment member; and
   biasing a first edge of said semiconductor package to a first wall of an aperture of said alignment member using said biasing element.

17. The method of claim 16 wherein said step of maintaining alignment includes the step of biasing a second edge of said package against a second wall of said aperture using said biasing element.

18. The method of claim 16 further comprising the step of:
   applying pressure to said first and second plurality of electrical contacts thereby forming a corresponding plurality of electrical connections between said first and second plurality of electrical contacts.

* * * * *